(12) United States Patent
Miyazaki et al.

(10) Patent No.: US 7,494,597 B2
(45) Date of Patent: Feb. 24, 2009

(54) METHOD AND APPARATUS FOR ETCHING DISK-LIKE MEMBER

(75) Inventors: Tadamitsu Miyazaki, Kanagawa (JP);
Kazuya Hirayama, Kanagawa (JP);
Hisaya Fukunaga, Kanagawa (JP);
Hiroyasu Futamura, Kanagawa (JP)

(73) Assignee: Sumco Techxiv Corporation, Nagasaki (JP)

( * ) Notice: Subject to any disclaimer, the term of this patent is extended or adjusted under 35 U.S.C. 154(b) by 285 days.

(21) Appl. No.: 10/566,959

(22) PCT Filed: Jul. 29, 2004

(86) PCT No.: PCT/JP2004/010808

§ 371 (c)(1),
(2), (4) Date: Jan. 27, 2006

(87) PCT Pub. No.: WO2005/013346

PCT Pub. Date: Feb. 10, 2005

(65) Prior Publication Data

US 2007/0017901 A1    Jan. 25, 2007

(30) Foreign Application Priority Data

Jul. 31, 2003    (JP) .............................. 2003-204248

(51) Int. Cl.
*C03C 15/00*     (2006.01)
*C23F 1/00*      (2006.01)
*H01L 21/306*    (2006.01)
*B44C 1/22*      (2006.01)

(52) U.S. Cl. .............................. 216/38; 216/83; 216/90; 216/91; 216/92; 134/1.3; 134/3; 134/26; 134/33; 134/94.1; 134/137; 134/902; 156/345.11

(58) Field of Classification Search .................... 216/90
See application file for complete search history.

(56) References Cited

U.S. PATENT DOCUMENTS

| | | | | |
|---|---|---|---|---|
| 3,964,957 | A | * | 6/1976 | Walsh .................... 156/345.23 |
| 4,113,543 | A | * | 9/1978 | Salles et al. ............. 156/345.23 |
| 4,407,621 | A | * | 10/1983 | Hansen ....................... 414/433 |
| 5,236,548 | A | * | 8/1993 | Stadler et al. ................. 216/91 |

(Continued)

FOREIGN PATENT DOCUMENTS

JP    04-323825    11/1992

(Continued)

OTHER PUBLICATIONS

Chinese Office Action in related case with English translation, Aug. 24, 2007.

*Primary Examiner*—Anita K Alanko
(74) *Attorney, Agent, or Firm*—Husch Blackwell Sanders LLP Welsh & Katz

(57) ABSTRACT

Disclosed are a method and apparatus for etching disk-shaped members, especially a method and apparatus for etching semiconductor wafers. In a method wherein wafers (30) are rotated and etched in an etching chamber (12) which is filled with an etching solution, a non-rotating cell plate (26) is disposed between two rotating wafers (30). In an etching apparatus wherein multiple wafers (30) are supported and rotated by a rod (16), the cell plate (26) is disposed between each two wafers (30). The cell plate (26) has a surface area roughly equivalent to that of the wafer (30).

11 Claims, 12 Drawing Sheets

U.S. PATENT DOCUMENTS

| | | | |
|---|---|---|---|
| 5,340,437 A * | 8/1994 | Erk et al. | 438/747 |
| 5,672,212 A * | 9/1997 | Manos | 134/1.3 |
| 5,816,274 A * | 10/1998 | Bartram et al. | 134/140 |
| 6,153,533 A * | 11/2000 | Senn | 438/745 |
| 6,199,563 B1 * | 3/2001 | Uehara et al. | 134/25.4 |
| 6,337,030 B1 * | 1/2002 | Sakaguchi | 216/91 |
| 6,767,840 B1 * | 7/2004 | Uehara et al. | 438/745 |
| 6,797,075 B2 * | 9/2004 | Ching et al. | 134/32 |
| 2002/0139475 A1 | 10/2002 | Chen | |
| 2002/0190028 A1 * | 12/2002 | Srivastava et al. | 216/90 |
| 2006/0131276 A1 * | 6/2006 | Johnston et al. | 216/92 |

FOREIGN PATENT DOCUMENTS

| | | |
|---|---|---|
| JP | 08-078370 | 3/1996 |
| JP | 09-115867 | 5/1997 |
| JP | 10-335284 | 12/1998 |
| JP | 11-233486 | 8/1999 |
| JP | 2000183026 A * | 6/2000 |
| JP | 2001284305 A * | 10/2001 |

* cited by examiner

SFQR Max Sites

SFQR All Sites

Average by Site

|       |       | 0.180 | 0.198 | 0.197 | 0.166 |       |       |
|-------|-------|-------|-------|-------|-------|-------|-------|
|       | 0.219 | 0.272 | 0.177 | 0.182 | 0.271 | 0.220 |       |
| 0.158 | 0.275 | 0.139 | 0.195 | 0.235 | 0.184 | 0.281 | 0.160 |
| 0.192 | 0.166 | 0.163 | 0.305 | 0.331 | 0.228 | 0.192 | 0.190 |
| 0.201 | 0.173 | 0.151 | 0.297 | 0.331 | 0.210 | 0.174 | 0.187 |
| 0.173 | 0.284 | 0.122 | 0.151 | 0.169 | 0.146 | 0.260 | 0.152 |
|       | 0.235 | 0.270 | 0.171 | 0.170 | 0.255 | 0.221 |       |
|       |       | 0.185 | 0.159 | 0.153 | 0.173 |       |       |

Failure by Site (Threshold=<0.5um)

|    |    | 0% | 0% | 0% | 0% |    |    |
|----|----|----|----|----|----|----|----|
|    | 0% | 4% | 0% | 0% | 4% | 0% |    |
| 0% | 0% | 0% | 0% | 0% | 0% | 4% | 0% |
| 0% | 0% | 0% | 0% | 0% | 0% | 0% | 0% |
| 0% | 0% | 0% | 0% | 0% | 0% | 0% | 0% |
| 0% | 4% | 0% | 0% | 0% | 0% | 0% | 0% |
|    | 0% | 4% | 0% | 0% | 0% | 0% |    |
|    |    | 0% | 0% | 0% | 0% |    |    |

METHOD AND APPARATUS FOR ETCHING DISK-LIKE MEMBER

TECHNICAL FIELD

The present invention relates to method and apparatus for etching disk-shaped members, in particular to an etching method and an etching apparatus for semiconductor wafers.

BACKGROUND ART

A typical method for manufacturing mirror-surface wafers employed as raw material wafers for fabricating semiconductor devices will be explained below. First, a single-crystal semiconductor ingot is grown by the Czochralski method (CZ method) or the floating zone melting method (FZ method). Because the grown semiconductor ingot is distorted on the outer periphery thereof, the outer periphery of the semiconductor ingot is subsequently ground in a contour grinding process, e.g. with a cylindrical grinding tool, and the outer peripheral shape of the semiconductor ingot is adjusted. The ingot is then sliced with a wire saw or the like in a slicing process and machined to obtain disk-shaped wafers with a thickness of about 500-1000 μm, and the outer periphery of the wafers is then chamfered in a chamfering process.

Flattening is then conducted by lapping, followed by an etching process, then primary polishing, and secondary polishing. Mirror-surface wafers are then obtained by conducting epitaxial growth process on the wafer surface.

The above-described etching process is carried out for the purpose of removing processing-induced distortion that occurred in the previous processes, minute defects present on the front and rear surfaces of the wafers, and the matter adhered thereto. An etching apparatus is used for etching the front and rear surfaces of the wafers in the etching process. The conventional etching apparatus will be briefly described below with reference to FIG. 12. FIG. 12 is a longitudinal sectional view of the conventional etching apparatus, as viewed from the front surface thereof.

This etching apparatus mainly comprises an etching chamber 12 filled with an etching solution, a plurality of rods 16 for supporting and rotating a multiplicity of wafers 30, and a housing 10 accommodating the tank and the rods. A plurality of annular wafer support grooves 124 are provided equidistantly on the circumferential surface of the rods 16, and the outer peripheral sections of wafers 30 are fitted into the wafer support grooves 124 to hold the wafers 30. On the other hand, the rods 16 rotate about the central axis thereof.

With the etching apparatus of such configuration, if the inside of the etching chamber 12 is filled with an etching solution and the rods 16 are rotated, the wafers that are in contact by the outer periphery thereof with the rods 16 will also rotate. The etching solution located around the wafers 30 is stirred by the rotation of the wafers 30 and the front and rear surfaces of the wafers are etched. After such etching has been carried out for a prescribed time, the wafers 30 are taken out from the etching apparatus, thereby completing the wafer etching process.

DISCLOSURE OF THE INVENTION

Problems to be Solved by the Invention

However, in such conventional etching apparatus, turbulence in solution occurs between the wafers due to interaction of the rotating wafers in the etching process. This turbulence makes a significant contribution to the degradation of flatness characteristic after etching and degradation of nanotopology by minute undulation.

The present invention was created to resolve the above-described problems, and it is an object to provide an etching method and an etching apparatus capable of suppressing turbulence occurring in the etching solution and improve flatness quality and nanotopology quality after etching.

In order to attain this object, a first aspect of the present invention provides an etching method in which two or more disk-shaped members immersed into an etching solution are held in a state where the plate surfaces thereof face each other, and etching is conducted while rotating the members, wherein a non-rotating member is disposed between the members.

A second aspect of the present invention provides the etching method of the first aspect of the invention, wherein the non-rotating member has a substantially disk shape.

A third aspect of the present invention provides the etching method of the first or second aspect of the invention, wherein the surface area of the non-rotating member is 95-105% of the surface area of the members.

A fourth aspect of the present invention provides the etching method of any of the first to third aspect of the invention, wherein the members are semiconductor wafers.

A fifth aspect of the present invention provides an etching apparatus comprising an etching chamber filled with an etching solution, and a plurality of rods rotatably supported in contact with the outer periphery of a plurality of disk-shaped members to rotatably hold the members in a state where the plate surfaces of the members face each other, wherein a non-rotating member is arranged in a position between the members held by the member holding means.

A sixth aspect of the present invention provides the etching apparatus of the fifth aspect of the invention, further comprising support columns fixed parallel to the rods, wherein the non-rotating member is fixed to the support columns.

A seventh aspect of the present invention provides the etching apparatus of the fifth or sixth aspect of the invention, wherein the non-rotating member has a substantially disk shape.

An eighth aspect of the present invention provides the etching apparatus of any of the fifth to seventh aspect of the invention, wherein the surface area of the non-rotating member is 95-105% of the surface area of the members.

A ninth aspect of the present invention provides a non-rotating member for an etching apparatus comprising an etching chamber filled with an etching solution, and a plurality of rods rotatably supported in contact with the outer periphery of a plurality of disk-shaped members to rotatably hold the members in a state where the plate surfaces of the members face each other, wherein the non-rotating member is supported on the rods in place of the members, and a protruding section for preventing the rotation of the non-rotating member is provided on the outer periphery thereof.

A tenth aspect of the present invention provides the non-rotating member of the ninth invention, wherein the non-rotating member has a substantially disk shape.

An eleventh aspect of the present invention provides the non-rotating member of the ninth or tenth aspect of the invention, wherein the surface area of the non-rotating member is 95-105% of the surface area of the members.

A twelfth aspect of the present invention provides the non-rotating member of any of the ninth or eleventh aspect of the invention, wherein the non-rotating member is made from polypropylene.

A thirteenth aspect of the present invention provides a method for manufacturing semiconductor wafers comprising a step of etching at least two wafers immersed into an etching solution, while holding the wafers so that the plate surfaces thereof face each other and rotating the wafers, wherein a member that changes the flow of the etching solution between every pair of adjacent wafers is arranged.

With the etching apparatus in accordance with the present invention, the flatness of the etched front and rear surfaces of the wafers can be improved. In particular, the flatness of the front and rear surface in the vicinity of the wafer center can be improved.

Furthermore, the present invention can be easily employed in the conventional etching apparatus by merely mounting the cell plates in the wafer mounting positions in accordance with the present invention.

BRIEF DESCRIPTION OF THE DRAWINGS

FIGS. 10(a)-10(d) show data obtained when etching was conducted on 25 wafers by using the conventional etching apparatus and sampling was conducted from the 25 etched wafers;

FIGS. 11(a)-11(d) show data obtained when etching was conducted on 20 wafers by using the etching apparatus employing the present invention and sampling was conducted from the 20 etched wafers.

EXPLANATION FOR REFERNCE NUMERALS

Figure 1:
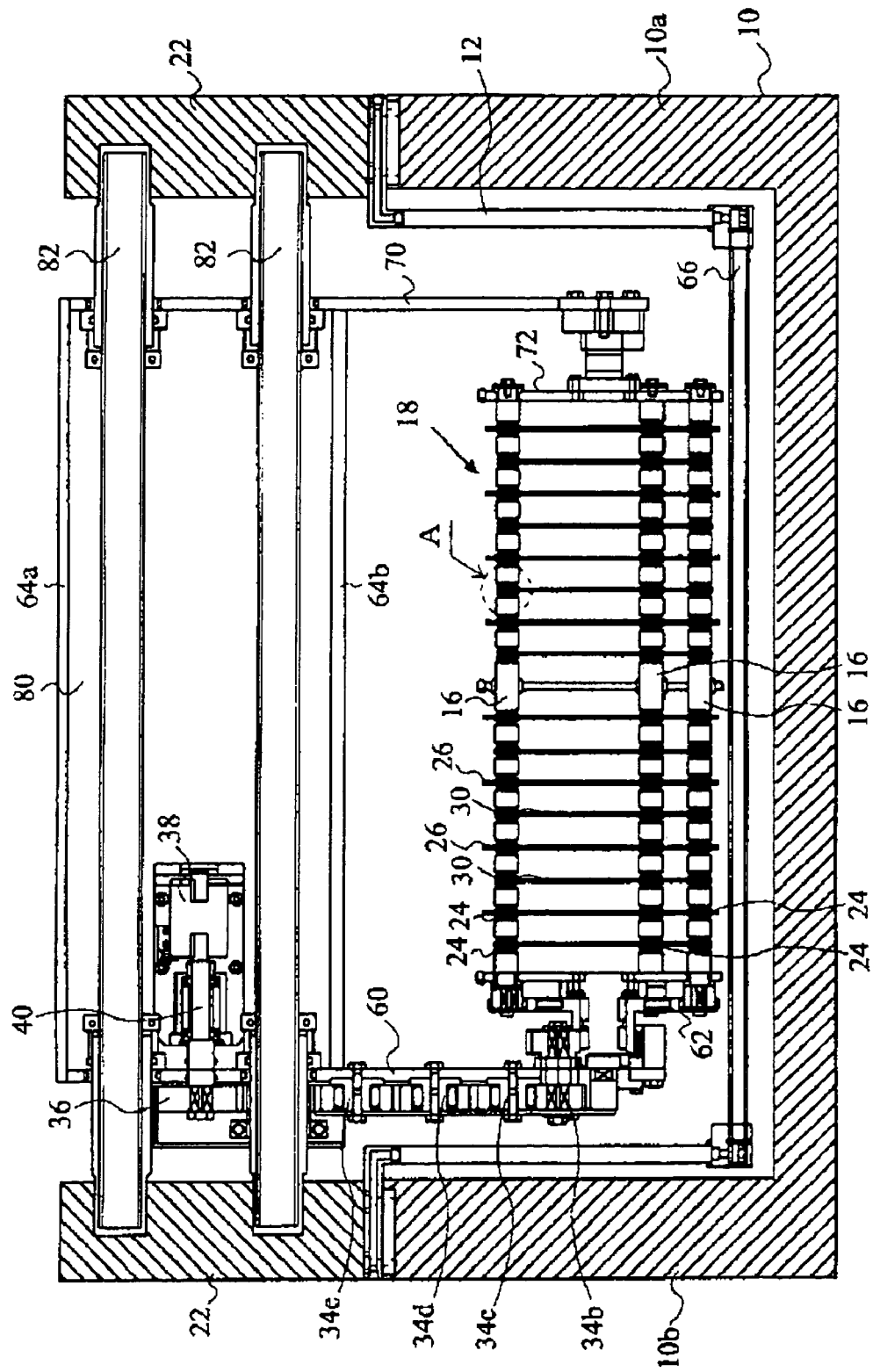
FIG. 1 is a longitudinal sectional view of the etching apparatus of a first embodiment, as viewed from the front surface thereof.

10 . . . housing 10a . . . side plate 10b . . . side plate
12 . . . etching chamber 12a . . . side plate 12b . . . side plate
14 . . . storage tank
16 . . . rod
18 . . . barrel
20 . . . pump
22 . . . support stand
24 . . . support groove
26 . . . cell plate
28 . . . protruding section
30 . . . wafer
32 . . . gear
34a . . . gear 34b . . . gear 34c . . . gear
34d . . . gear 34e . . . gear 34f . . . gear
35 . . . gear 35a . . . small gear 35b . . . large gear
36 . . . drive gear
38 . . . drive motor
40 . . . drive shaft
42 . . . filter
44 . . . pipe
46 . . . discharge pipe
48 . . . discharge valve
50 . . . supply pipe
52 . . . supply valve
60 . . . left support arm
62 . . . left bracket
64a . . . lid plate 64b . . . bottom plate
66 . . . air pipe
70 . . . right support arm
72 . . . right bracket
80 . . . box
82 . . . support beam
120 . . . support column
122 . . . cell plate support groove
124 . . . wafer support groove
126 . . . cell plate
128 . . . stopper
160 . . . left support arm
162 . . . left bracket
170 . . . right support arm
172 . . . right bracket
226 . . . cell plate
326 . . . cell plate

BEST MODE FOR CARRYING OUT THE INVENTION

The etching method and etching apparatus in accordance with the present invention will be explained below in greater detail with reference to the appended drawings. The present invention is applicable to various etching apparatuses where wafers are held parallel to each other, and for example can be applied to the below-described etching apparatus. However, the description below merely illustrates the modes for carrying out the invention and the present invention is not limited thereto.

EMBODIMENT 1

Figure 2:
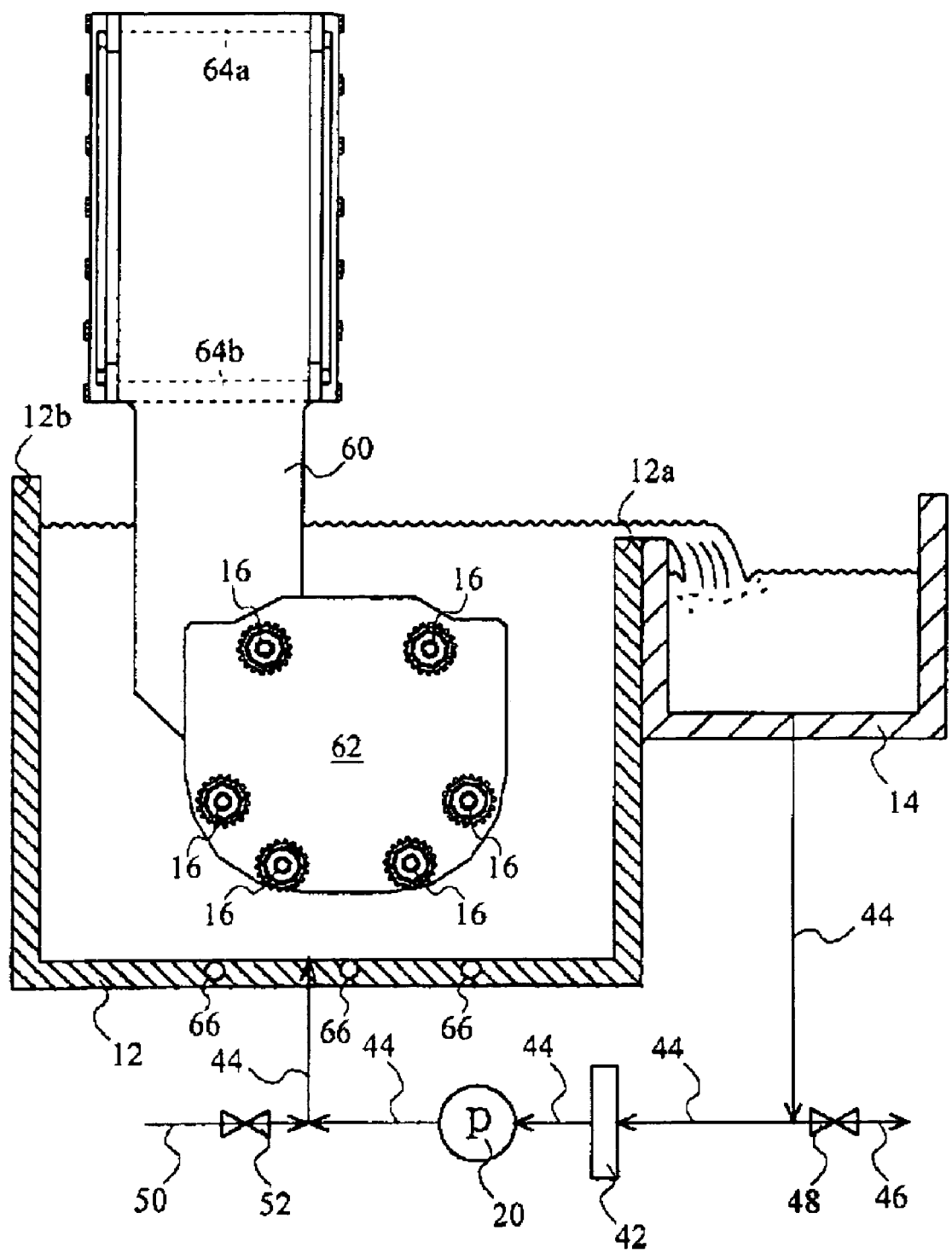
FIG. 2 is a longitudinal sectional view of the etching apparatus of the first embodiment, as viewed from the left side surface thereof.
Figure 3B:
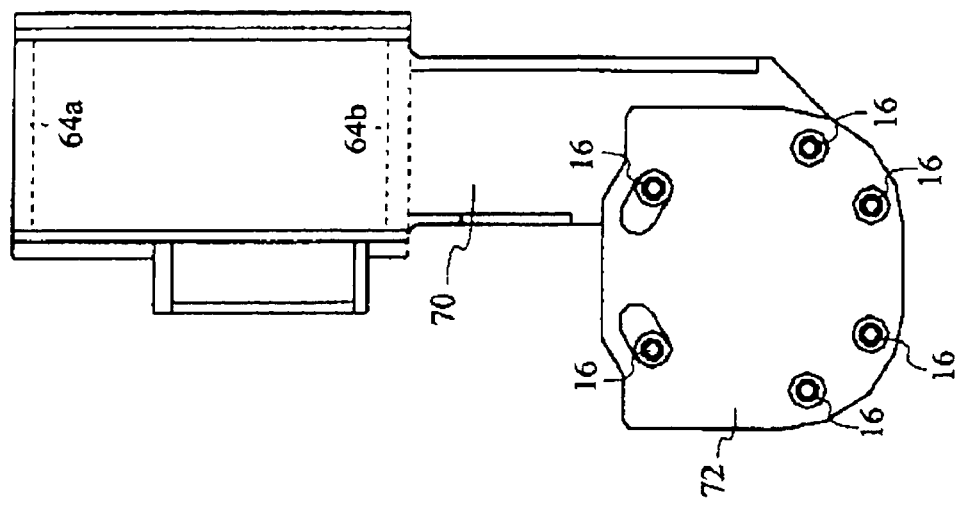
FIG. 3(b) is a longitudinal sectional view of the right support arm 70 and right bracket 72 of the first embodiment.
Figure 3A:
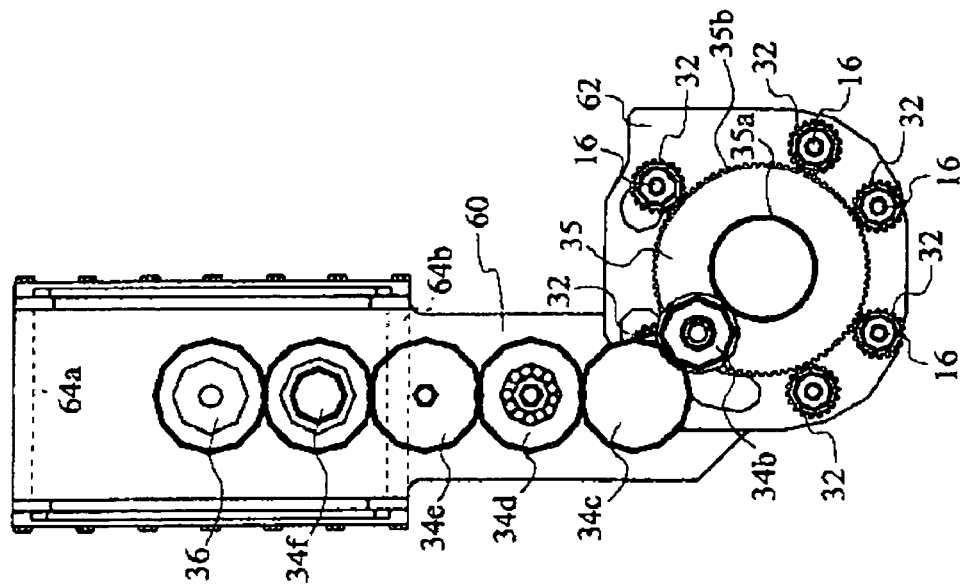
FIG. 3(a) is a longitudinal sectional view of the left support arm 60 and left bracket 62.
Figure 4A:
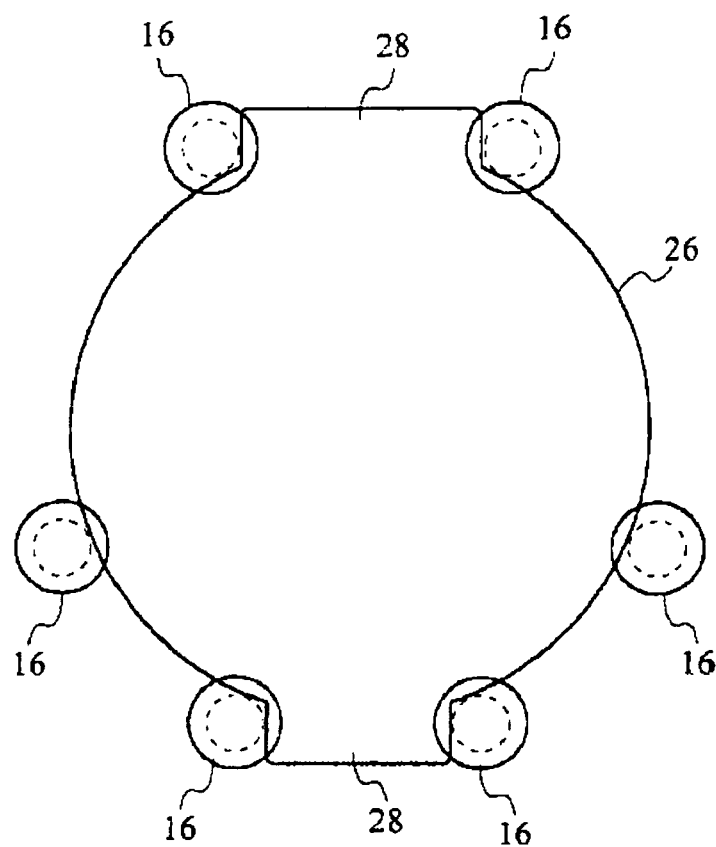
FIG. 4(a) is a longitudinal sectional view of the barrel of the first embodiment.
Figure 4B:
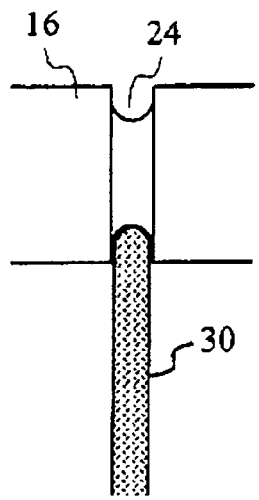
FIG. 4(b) is an enlarged view of section A shown in FIG. 1.

The first embodiment of the present invention will be described below with reference to FIG. 1 to FIG. 4. FIG. 1 is a longitudinal sectional view of the etching apparatus of the present embodiment, as viewed from the front surface thereof. FIG. 2 is a longitudinal sectional view of the etching apparatus, as viewed from the left side surface thereof FIG. 3(a) is a longitudinal sectional view of a left support arm 60 and a left bracket 62. FIG. 3(b) is a longitudinal sectional view of a right support arm 70 and a right bracket 72. FIG. 4(a) is a longitudinal sectional view of a barrel. FIG. 4(b) is an enlarged view of section A shown in FIG. 1.

The entire structure of the etching apparatus will be explained below with reference to FIG. 1 to FIG. 4. In this embodiment, a plurality of wafers 30 are etched after being arranged in a row and mounted on the etching apparatus.

As shown in FIG. 1 and FIG. 2, the etching apparatus of the present embodiment comprises a box-like housing 10 accommodating all the units, an etching chamber 12 filled with an etching solution, a storage tank 14 for recovering the etching solution overflowing the etching chamber 12, a barrel 18 comprising six rods 16 for supporting and rotating the wafers 30, and a pump 20 for circulating the etching solution. No specific limitation is placed on the number of rods; it is preferred that the number of rods be four or more, but three or fewer rods may be also used.

As shown in FIG. 1, the housing 10 has a box-like structure comprising four side plates and one bottom plate. This box-like housing 10 accommodates the etching chamber 12 inside thereof. Furthermore, support stands 22 in the form of thick plates are provided, by one on the left and right side, in a vertical condition on the top surface of the side plates 10a, 10b of the housing 10. Two straight support holes are drilled horizontally in each of the mutually opposite surfaces in the two support stands 22 shown on the left and right sides of FIG. 1. The two support holes are drilled somewhat above and somewhat below the centers of each support stand 22. Both end sections of two rod-like support beams 82 are inserted into the support holes, and the support beams 82 are supported horizontally between the support stands 22.

The support beams 82 that are thus supported horizontally by the support stands 22 support a left support arm 60 and a right support arm 70 of a substantially plate-like shape. The left support arm 60 and right support arm 70 are provided in the upper portion and somewhat above the center thereof with two through holes having the same diameter as that of the support beams 82, the two support beams 82 are inserted into the two through holes, and the left support arm 60 and right support arm 70 are supported by the two support beams 82.

A lid plate 64a in the form of a flat plate is supported on top of the left support arm 60 and right support arm 70. Similarly, a bottom plate 64b in the form of a flat plate is supported in the central portions of the left support arm 60 and right support arm 70. Sheet materials in the form of flat plates (not shown in the figure) are supported on the front and rear sides so as to be in contact with the side surfaces of the lid plate 64a and bottom plate 64b, and the box-like BOX80 is constituted by the top portion of the left support arm 60, the top portion of the right support arm 70, sheet materials (not shown in the figure), the lid plate 64a, and the bottom plate 64b.

On the other hand, a left bracket 62 with a substantially disk-like shape is connected to the left support arm 60, so that the plate surface of the left support arm 60 and the plate surface of the left bracket 62 face each other. Similarly, a right bracket 72 with a substantially disk-like shape is connected to the right support arm 70, so that the plate surface of the right support arm 70 and the plate surface of the right bracket 72 face each other. A total of six holes for inserting the six rods 16 are drilled in the opposing surfaces of the left bracket 62 and right bracket 72.

The six cylindrical rods 16 are inserted by one end portion thereof into the holes drilled in the left bracket 62 and inserted by the other end portion thereof into the holes drilled in the right bracket 72. As a result, the rods 16 are supported horizontally inside the etching chamber 12 parallel to the longitudinal direction thereof. A plurality of ring-like wafer support grooves 24 are provided equidistantly on the circumferential surface of each rod 16, and the wafers 30 are held by fitting the outer peripheral portions of the wafers 30 into the wafer support grooves 24.

The six rods 16 are arranged on the circumference of the wafers 30 so that the wafers 30 can be supported and rotated, as shown in FIG. 4(a). More specifically, four rods are arranged below and two rods are arranged above the positions where the wafers 30 located inside the barrel 18 have to be loaded. In particular, the six rods 16 are preferably arranged with a left-right symmetry with respect to the wafers 30.

FIG. 4(b) is an enlarged view of the section A shown in FIG. 1. As shown in FIG. 4(b), each rod 16 has a support groove 24 having a cross-sectional shape almost identical to that of the chamfer shape on the outer periphery of the wafers, and the wafers 30 are supported by fitting the outer periphery of the wafers 30 into the support grooves 24. The width of the support groove 24 is preferably larger than the thickness of the wafer 30, and the support 24 is formed so that the wafer 30 is loosely fit into the support groove 24.

As shown in FIG. 3(a), a gear 32 is fixed to the distal end portion of the rod 16 inserted into the left bracket 62. A total of five gears 34f, 34e, 34d, 34c, 34b are arranged vertically from top to bottom in the successively engaged state on the left support arm 60 (detailed representation of the gears in FIG. 3(a) is partially omitted). A gear 35 is arranged in the center of the left bracket 62. In the gear 35, a small gear 35 is placed on and coaxially connected to a large gear 35b. The gear 34b is engaged with the small gear 35a, and a large gear 35b is engaged with each gear 32 fixed to one end portion of the rods 16. The six rods 16 are rotated together because all the six gears 32 are engaged with large gears 35b of the gear 35.

Furthermore, the topmost gear 34f is engaged with a drive gear 36, and the drive gear 36 is fixed to a drive shaft 40 of a drive motor 38 provided inside the BOX80, as shown in FIG. 1. The rotation of the drive motor 38 is successively transferred from the drive gear 36 to the gears 34f, 34e, 34d, 34c, 34b, then to the small gear 35a of the gear 35, and then from the large gear 35b of the gear 35 to six gears 32.

The drive motor 38 is connected to a control unit (not shown in the figure) and can provide for rotation in any direction and at any speed. The control unit may be provided inside the BOX80, or may be a control device such as a personal computer provided separately from the BOX80. Furthermore, if the control unit is connected to a display, then the information relating to the speed or direction of wafer rotation may be displayed in a graphical or numerical form on the display, and the operator may carry out the operations by referring to the displayed information, or the control may be conducted automatically according to a program.

As shown in FIG. 3(b), the end portions of rods 16 inserted into the right bracket 72 are supported by the right bracket 72 via guide bushes. As a result, the rods 16 can be smoothly rotated with respect to the right bracket 72. With such a configuration, the rotation of the drive motor 38 is transmitted to the rods 16 and the rods 16 can be rotated at any speed and in any direction. Furthermore, as described above, rotating the rods 16 at any speed and in any direction makes it possible to rotate the wafers 30 that are in contact by the outer periphery thereof with the support grooves 24 at any speed and in any direction.

As shown in FIG. 1, in order to support the wafers 30 and cell plates 26, the six rods 16 are provided with 16 support grooves 24 with a width of 1.5 mm and a depth of 2 mm, the pitch of the support grooves 24 being 38 mm. A total of 8 wafers 30 and 8 cell plates 26 are alternately mounted in the form of a lateral stack in which the surfaces of the wafers 30 and cell plates 26 are parallel to each other in the 16 support grooves 24.

As shown in FIG. 4(a), the cell plates 26 are thin plates having a substantially disk shape with a thickness of 0.7-1.5 mm and a diameter of 197-199 mm. Furthermore, the cell plates 26 have two rectangular protruding sections 28 in the upper and lower portions on the outer periphery thereof. The protruding sections 28 are fabricated so that the size thereof matches the width between the rods 16, and when the cell plates 26 are mounted on the support grooves 24, the protruding sections 28 hang on the rods 16. The cell plates 26 are mounted inside the support grooves 24, similarly to the wafers 30 shown in FIG. 4(b), but because the diameter thereof is less than the diameter (200 mm) of the wafers 30, the cell plates are loose inside the support grooves 24. As a result, even when the rods 16 are rotated, the cell plates 26 do not rotate, and the cell plates 26 are locked so that they cannot rotate in a state of alignment with the positions of the support grooves 24.

In the present embodiment, polypropylene having resistance against etching solutions is used as a material of the cell plates 26. However, other materials can be also advantageously used, provided they have certain strength and acid resistance, vinyl chloride being an example of such materials.

On the other hand, as shown in FIG. 2, a box-like storage tank 14 is provided adjacently to the etching chamber 12. The height of the side plate 12a of the etching chamber 12 abutting against of the storage tank 14 is less than the height of the other side plate 12b, thereby making it possible to recover the etching solution overflowing the etching chamber 12 into the storage tank 14.

The storage tank 14 is connected to a pump 20 with a pipe 44. A filter 42 is provided between the storage tank 14 and the pump 20, and the etching solution flowing out from the storage tank 14 is filtered. Furthermore, a discharge pipe for discharging the spent etching solution is connected via a discharge valve 48 to the pipe 44 located between the storage tank 14 and the filter 42. The discharge pipe 46 is connected to a waste solution tank (not shown in the figures) for discarding the etching solution.

A supply pipe 50 for supplying new etching solution is connected via a supply valve 52 to the pipe 44 located between the pump 20 and the etching chamber 12. The etching solution present in the etching chamber 12 can be adjusted to the desired concentration by opening the supply valve 52 to increase the concentration of the etching solution present in the etching chamber 12 and closing the supply valve 52 to decrease the concentration of the etching solution. In this process, the quantity of etching solution supplied to the etching chamber 12 is adjusted to a constant level by regulating the opening and closing of the discharge valve 48 according to the quantity of etching solution supplied from the supply pipe 50.

Furthermore, as shown in FIG. 1, air pipes 66 for blowing air are provided in the bottom portion of the etching chamber 12. The air pipes 66 are provided parallel to the longitudinal direction of the etching chamber 12, and each air pipe 66 is connected to an air pump (not shown in the figure). Each air pipe 66 comprises holes for air supply that are provided with the prescribed pitch in the lengthwise direction, and air is supplied to the etching solution located inside the etching chamber 12 from those holes.

The operation of the etching apparatus of the above-described configuration will be explained below with reference to FIGS. 1 to 4.

First, the supply valve 52 shown in FIG. 2 is open, and the etching chamber 12 is filled with the prescribed quantity of the etching solution through the supply pipe 50. Any generally used etching solution can be employed. For example, a mixed acid obtained by mixing nitric acid, acetic acid, and hydrofluoric acid can be used. The etching solution is adjusted to the preset prescribed temperature by the temperature adjustment mechanism (not shown in the figure).

Then, the operator fits the wafers 30 one by one with pincers into the support grooves 24 in the etching device having the cell plates 26 mounted thereon in advance and mounts the wafers 30 on the etching device, as shown in FIG. 1. Once the wafers 30 have been mounted, the drive motor 38 is rotated from the control unit and the rods 16 are rotated. In this case, the rotation of the rods 16 causes the wafers that are in contact by the outer periphery thereof with the support grooves 24 of the rods 16. Controlling the rotation speed of the drive motor 38 with the control unit makes it possible to rotate the wafers 30 at a rate of 10-60 rpm and to change the rotation direction at any section.

The etching solution present in the storage tank 14 shown in FIG. 2 is supplied to the filter 42 via the pipe 44. The etching solution sent to the filter 42 is filtered with the filter 42 and then sent to the pump 20. The etching solution sent to the pump 20 is pumped to the bottom section of the etching chamber 12. The pumping rate is adjusted to about 40 L/min. As a result, the etching solution present inside the etching chamber 12 overflows the tank.

The etching solution that overflows the etching chamber 12 is recovered in the storage tank 14. The etching solution that was recovered in the storage tank 14 is again pumped by the pump 20 to the bottom portion of the etching chamber 12 through the pipe 44 and via the filter 42. The etching solution thus circulates inside the etching apparatus.

Since the etching solution passes through the filter 42 during circulation, foreign matter contained in the etching solution is filtered out by the filter 42 and the etching solution is maintained in a clean state. Furthermore, because the inside of the etching chamber 12 has an ascending flow of the etching solution, the etching solution that comes into contact with the front and rear surfaces of the wafers is stirred. As a result, stagnation of the etching solution is prevented, and nonuniform etching of the front and rear surface of the wafers is inhibited.

In this state, the etching of the wafers 30 is conducted for the prescribed replacement time. As a result, the front and rear surfaces of the wafers 30 are subjected to target replacement etching. After completion of the etching, the wafers 30 removed from the etching chamber 12 are rapidly transferred into a washing tank (not shown in the figures) and washed.

With the present embodiment, the present invention can be easily employed without modifying the conventional etching apparatuses. Thus, the present invention can be easily employed by mounting the cell plates 26 and wafers 30 alternately in the support grooves 24 for wafers in the conventional etching apparatus.

EMBODIMENT 2

The second embodiment of the present invention will be described below with reference to FIGS. 5 to 7. As described below, a specific feature of the present embodiment is that support columns 120 for fixing the cell plates are provided in the configuration of the first embodiment. Because the two configurations are identical in other aspects, the identical components will be assigned with the reference symbols of the first embodiment and specific explanation thereof will be omitted. Thus, only the support columns 120 and cells plates 126, which represent the difference between the embodiments, will be explained below.

Figure 5:
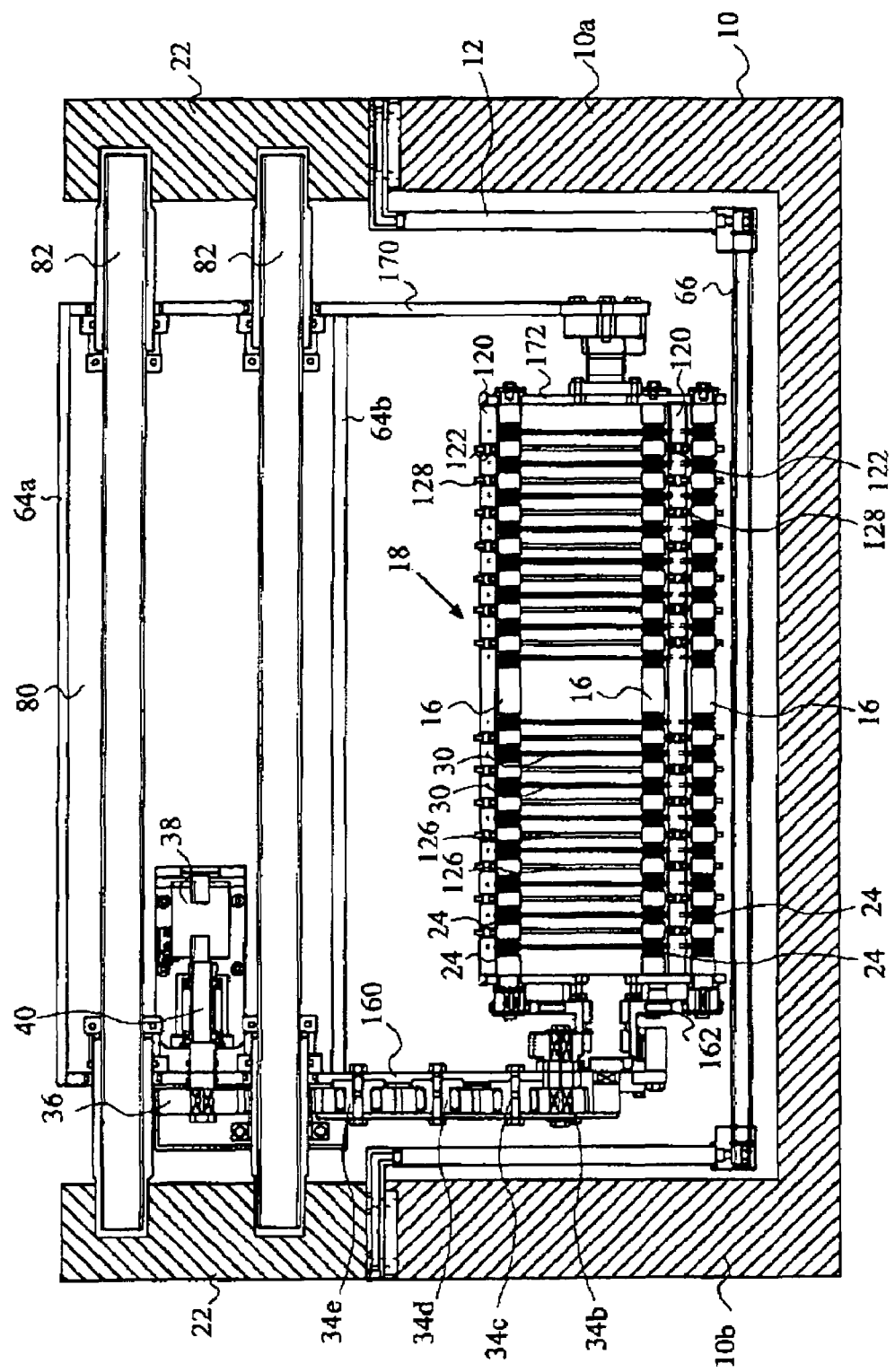
FIG. 5 is a longitudinal sectional view of the etching apparatus of a second embodiment, as viewed from the front surface thereof.

FIG. 5 is a longitudinal sectional view of the etching apparatus of the present embodiment, as viewed from the front surface thereof. FIG. 6(*a*) is a longitudinal sectional view of a left support arm 160 and a left bracket 162 in the second embodiment of the present embodiment. FIG. 6(*b*) is a longitudinal sectional view of the right support arm 170 and right bracket 172. FIG. 7(*a*) is a longitudinal sectional view of the barrel. FIG. 7(*b*) is a B-B' sectional view of FIG. 7(*a*).

Figure 6B:
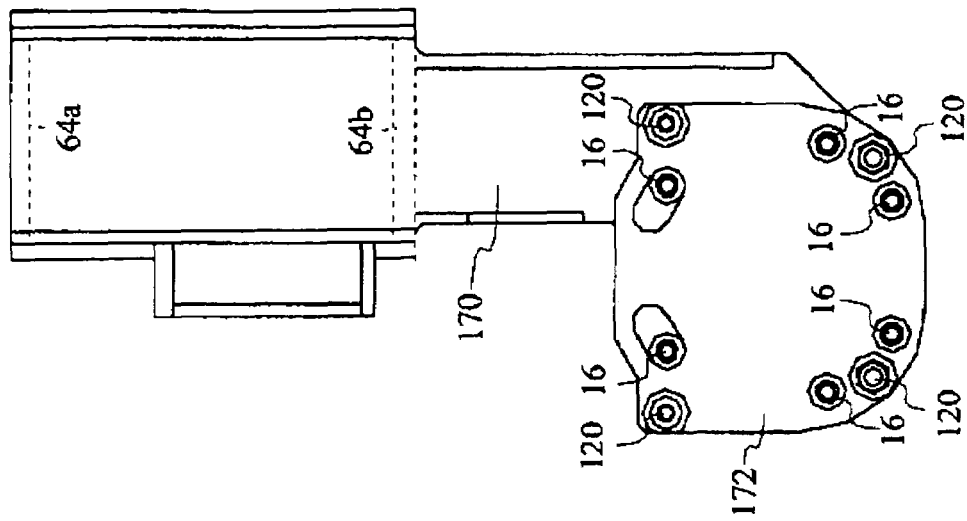
FIG. 6(b) is a longitudinal sectional view of the right support arm 170 and right bracket 172 of the second embodiment.
Figure 6A:
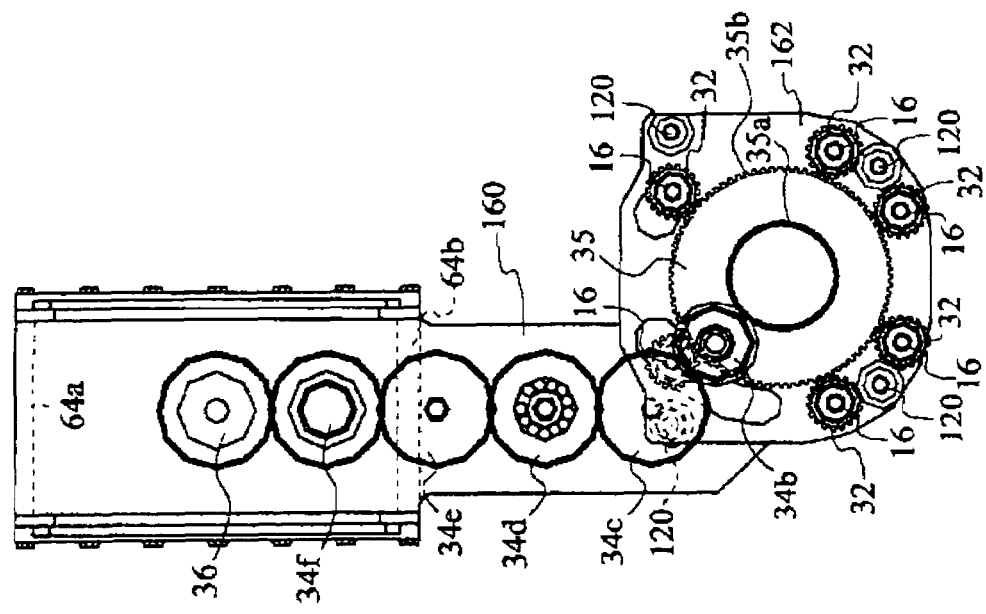
FIG. 6(a) is a longitudinal sectional view of the left support arm 160 and left bracket 162.
Figure 7A:
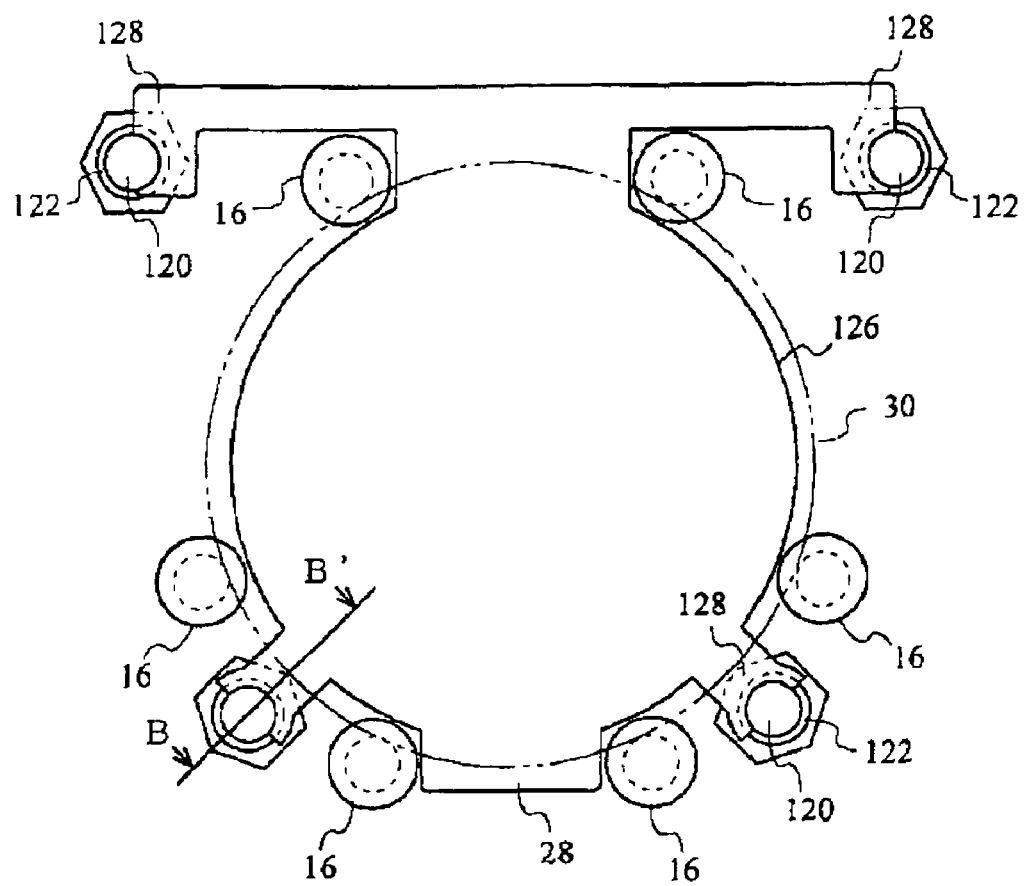
FIG. 7(a) is a longitudinal sectional view of the barrel of the second embodiment.
Figure 7B:
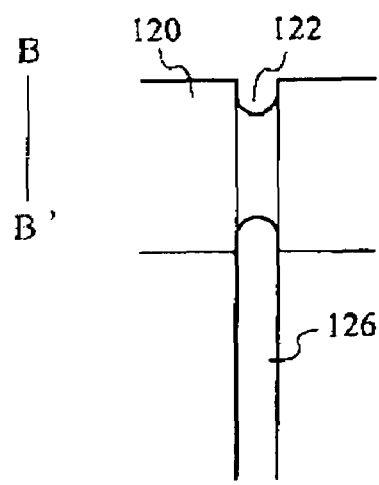
FIG. 7(b) is a B-B' sectional view of FIG. 7(a)

As shown in FIGS. 5 to 7, in the etching apparatus of the present embodiment, four support columns 120 are fixed parallel to the rods 16 to the left bracket 162 and right bracket 172. As shown in FIG. 7(*a*), the support columns 120 are arranged by two with the prescribed spacing in the vertical direction. As shown in FIG. 7(*b*), the support columns 120 are provided with cell plate support grooves 122 for fixing the cell plates 126 to the support columns 120.

As shown in FIG. 5, a total of 14 cell plate support grooves 122 are provided with a pitch of 38 mm in each support column 120, those grooves having a width of 1.5 mm. By contrast with 16 wafer support grooves 24, there are 14 cell plate support grooves 122 for the reason as follows.

Thus, as shown in FIG. 5, the wafers 30 positioned at both ends of the barrel 18 face the left bracket 162 and right bracket 172 and do not face other wafers 30 at the surfaces thereof that face to the outside of the barrel 18. Therefore, cell plates 126 are not required to be disposed on the surfaces that do not face other wafers 30. As a result, the cell plate support grooves 122 are disposed on the inner side of the wafer support grooves 24. Furthermore, in the central portion of the barrel 18, the distance between the wafer support grooves 24 is increased. Therefore, because the distance between the wafers 30 is increased, interaction of the wafers 30 during etching is reduced and it is hardly necessary to dispose the cell plates 126. For this reason, cell plate support grooves 122 are not provided in the center of the barrel 18.

The cell plate support grooves 122 are provided with a half-pitch displacement with respect to the wafer support grooves 24. As a result, the cell plate support grooves 122 are arranged so that the wafer support grooves 24 and cell plate support grooves 122 are located alternately in the longitudinal direction of the support column 120.

The cell plates 126 are thin plates with a substantially disk shape and have a thickness of 1.5 mm and a diameter of 196 mm. Furthermore, as shown in FIG. 7(*a*), the cell plates 126 have four protruding stoppers 128 on the outer periphery thereof. The distal end portion of the stopper 128 has a C-like shape, the inner peripheral portions with the C-like shape are fitted into the cell plate support grooves 122, as shown in FIG. 7(*b*), and 14 cell plates 126 are fixed to the support column 120.

In the present embodiment, the diameter of the cell plates 126 is set to 196 mm, which is less than the diameter of 200 nun of the wafers 30 in order to avoid contact of the cell plates 126 with the rod 16. However, the diameter of the cell plates 126 is not limited to this value and may be equal to the diameter of the wafers 30 or larger than the diameter of the wafers 30, but in those cases recesses have to be provided to avoid contact with the rods 16.

With consideration for the below-described test data, it is preferred that the diameter of the cell plates be almost equal to the diameter of the wafers 30. The advantage of making the cell plates 126 of about the same size or less than the wafers 30 is that the cell plates 126 do not serve as obstacles when the wafers 30 are mounted with pincers and the wafers 30 can be covered.

The thickness of cell plates 126 is not limited to 1.5 mm, and the effect of the present invention can be demonstrated with thicker or thinner cell plates. Therefore, thinner plates are generally preferred due to space saving requirements. However, because strength has to be ensured, a thickness of about 0.7-1.5 mm is preferred.

The operation of the etching apparatus of the above-described configuration will be described below with reference to FIGS. 5 to 7. First, similarly to the first embodiment, the etching chamber 12 is filled with the prescribed quantity of the etching solution.

Then, the operator fits the wafers 30 one by one with pincers into the wafer support grooves 24 and mounts the wafers 30 on the etching device, as shown in FIG. 5. As a result, 16 wafers 30 are arranged in a row with a pitch of 38 mm. Then, similarly to the first embodiment, the wafers 30 are rotated at a speed of 10-50 rpm and the rotation direction is changed after any number of seconds.

The pump is then driven and the etching solution is circulated. In this state, the etching of the wafers 30 is conducted for the prescribed replacement time. As a result, the front and rear surfaces of the wafers 30 are subjected to target replacement etching. After completion of the etching, the wafers 30 removed from the etching chamber 12 are rapidly transferred into a washing tank (not shown in the figures) and washed.

In the first embodiment, the cell plates 26 were fixed to the support grooves 24, but with such configuration, half of each support groove 24 is used for supporting the cell plate 26. On the other hand, in the second embodiment, cell plate support grooves 122 are provided to fix the cell plates 126 to separate support columns 120, thereby enabling the increase in productivity. Thus, since the wafer support grooves 24 are entirely used for supporting the wafers, the number of wafers that can be etched in one cycle is twice as large as that of the first embodiment.

In the present embodiment, the distance between the wafers and cell plates is halved with respect to that of the first embodiment, but the etching accuracy of the front and rear surfaces of the wafers was not changed. Therefore, with the present embodiment, the productivity can be doubled, while maintaining good etching accuracy.

In the above-described first and second embodiment, the explanation was conducted with respect to the case where all the wafers were rotated synchronously. However, a configuration may be also employed in which the adjacent wafers are rotated in opposite directions. Furthermore, in the configurations of the above-described embodiments, the cell plates were fixed, but a configuration may be also employed in which the cell plates are rotated in the direction opposite that of the wafers.

Figure 8A:
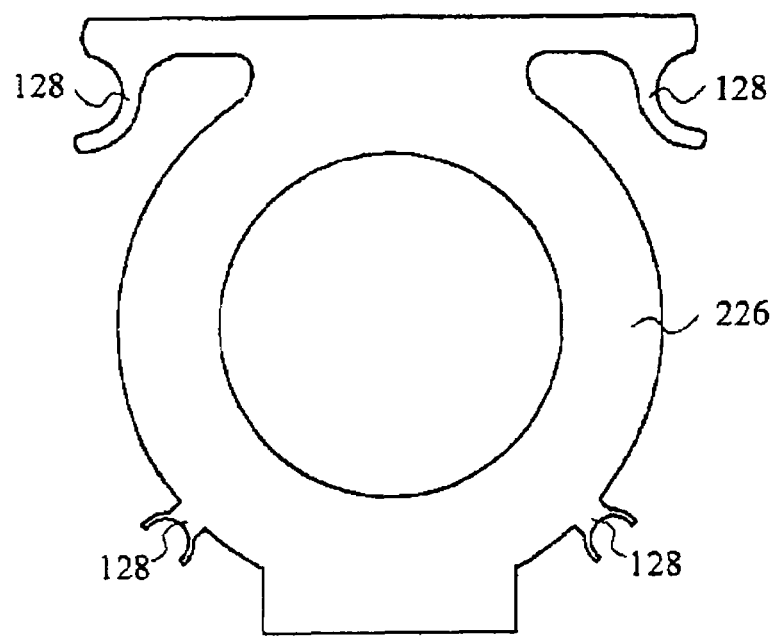
FIG. 8(a) is an embodiment of the subject invention showing a cell plate with a large orifice in the middle.
Figure 8B:
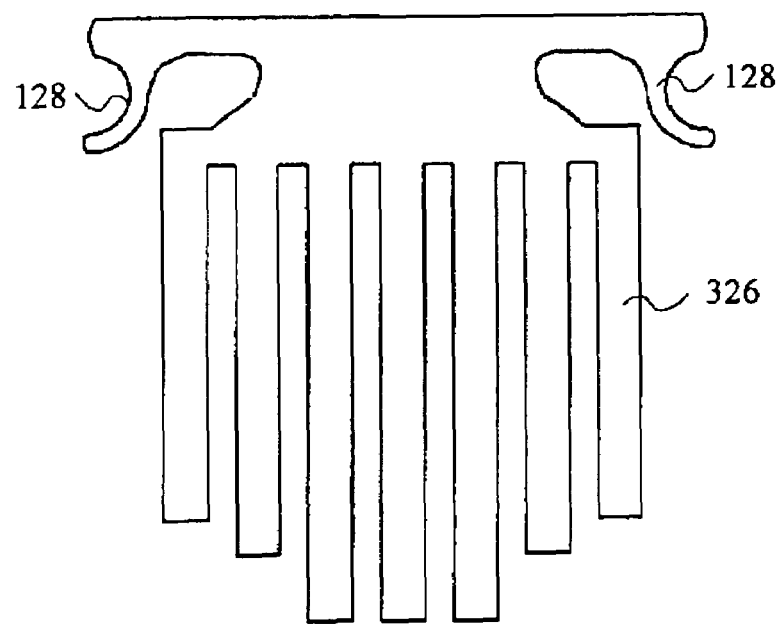
FIG. 8(b) is an embodiment of the subject invention showing a cell plate with a plurality of thin rectangular plates arranged in a row.

In the first and second embodiment, the cell plates had a substantially disk shape, but no limitation is placed on the shape of the cell plates. For example, cell plates 226 may be used which have a large orifice in the center, as shown in FIG. 8(*a*), or cell plates 326 in which a plurality of thin rectangular plates are arranged in a row, as shown in FIG. 8(*b*), may be also used. Thus, the cell plates may be configured to have any shape, provided they affect the flow of etching solution. Therefore, though the term "plate" usually refers to a sheet-like body, the term "cell plate" used in accordance with the present invention refers not only to a sheet-like body, but also to any body affecting the flow of etching solution.

Furthermore, in the embodiments, the case was explained where an acid mixture was used as the etching solution, but the present invention is also applicable to the case where alkali etching solutions are used. Any generally employed alkali etching solution can be used. For example, an etching solution prepared by mixing sodium hydroxide, isopropyl alcohol, and water can be used.

In the present embodiments, etching of semiconductor wafers was explained by way of an example, but it goes without saying that the present invention is also applicable to etching of other wafers or thin-sheet bodies, e.g., of metals.

Thus the present invention is not limited to the above-described embodiments, and the wafer rotation method, shape of cell plates, or type of etching solution can be modified and changed within the scope of the present invention.

Test Data

The case where wafers were etching by using the cell plates of the present invention will be explained below in greater detail by taking the cell plate size as a standard.

Figures 9A, 9B, 9C:
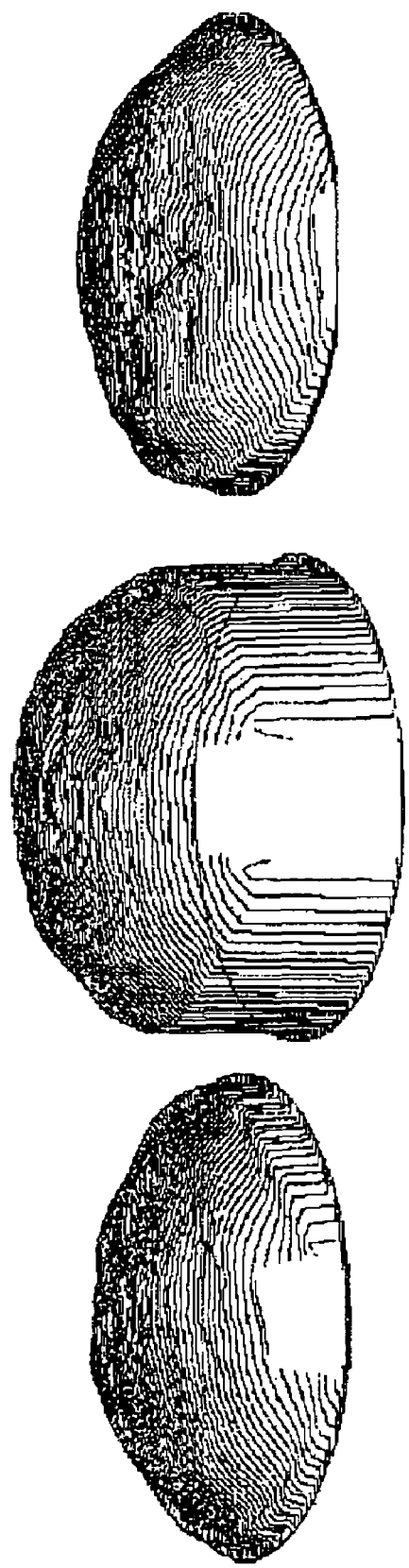
FIGS. 9(a)-9(c) show SFQR of the wafers after etching that was found, averaged, and visualized separately for the cases where the cell plate was larger than the wafer, smaller than the wafer, and of about the same size as the wafer.

The SFQR of wafers after etching was found, averaged and visualized, as shown in FIGS. 9(a)-9(c) separately for the cases of the cell plates larger than the wafers, smaller than the wafers, and about of the same size as the wafers.

FIG. 9(a) shows the sub-flatness (SFQR) of the wafers after etching conducted by mounting cell plates with a surface area 35% larger than that of the wafers. Here, the SFQR is one of the indicators of wafer flatness. More specifically, it is found by sampling a plurality of quadrangles (Sites) of the prescribed size (side of 25 mm) from an etched wafer, finding the difference with the desired wafer thickness of each sample, and calculating the average value of the values for each sample. The upper portion of FIG. 9(a) shows the SFQR of each site obtained by dividing into quadrangles with a side of 25 mm, and the lower portion of FIG. 9(a) shows the visualized SFQR.

Similarly, FIG. 9(b) shows the SFQR of the wafers after etching conducted by mounting cell plates with a surface area 30% smaller than that of the wafers, and FIG. 9(c) shows the SFQR of the wafers after etching conducted by mounting cell plates of the same size as the wafers.

Three-dimensional graphs obtained by visualization and shown in the lower portions of FIGS. 9(a)-9(c) demonstrate, that the best SFQR of the etched wafers is obtained when the cell plates were of about the same size as the wafers, as shown in FIG. 9(c). Those test data indicate that the size of the cell plates is preferably about the same as that of the wafers. In particular, it is preferred that the size of the surface area of cell plates be about 95-105% of that of the wafers. Here, the size of the surface area means the projection surface area obtained by projecting a cell plate on the adjacent wafer. Thus, as shown in FIG. 7(a), the surface area of the overlapping portions of the wafer 30 and cell plate 126 shown by a two-dot-dash line is preferably 95-105%.

On the other hand, etching the wafers with the conventional etching apparatus and with the etching apparatus employing the present invention will be compared below by using FIG. 10 and FIG. 11.

FIG. 10 shows data obtained by etching 25 wafers by using the conventional etching apparatus and sampling from 25 etched wafers.

Figure 10A:
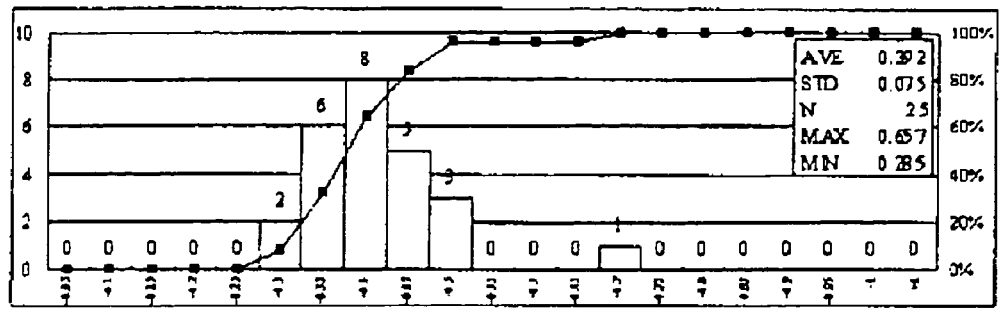

FIG. 10(a) is a graph in which a maximum SFQR in a certain wafers sampled of 25 wafers is plotted against the abscissa, and the number of wafers having this maximum SFQR is plotted against the ordinate.

Figure 10B:
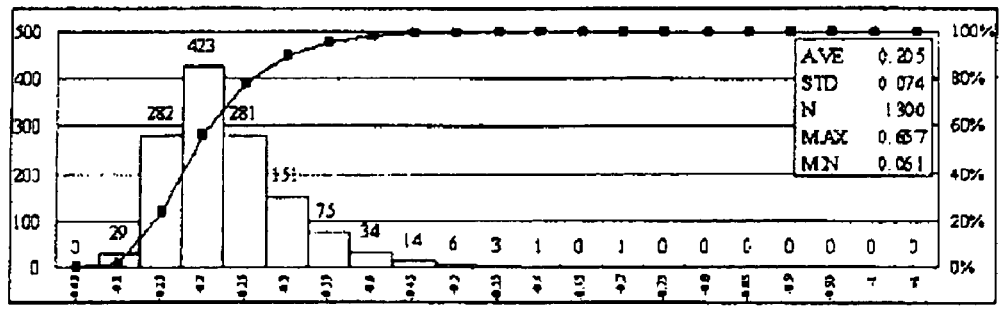

FIG. 10(b) is a graph in which a SFQR value obtained by sampling SFQR values of a total of 1300 sites from 25 wafers is plotted against the abscissa, and the number of sites having this SFQR value is plotted against the ordinate.

FIG. 10(c) is a graph showing the average values of SFQR for each site position obtained by sampling 25 wafers.

FIG. 10(d) is a graph showing the ration of defected sites with a SFQR of 5 μm or more for each site position, the threshold being 5 μm.

On the other hand, FIG. 11 shows data obtained when etching was conducted on 20 wafers by using the etching apparatus employing the present invention and sampling was conducted from the 20 etched wafers. The graphs and figures in FIGS. 11 (a)-11(d) show the contents similar to that in the corresponding FIGS. 10(a)-11(d).

Figure 11A:
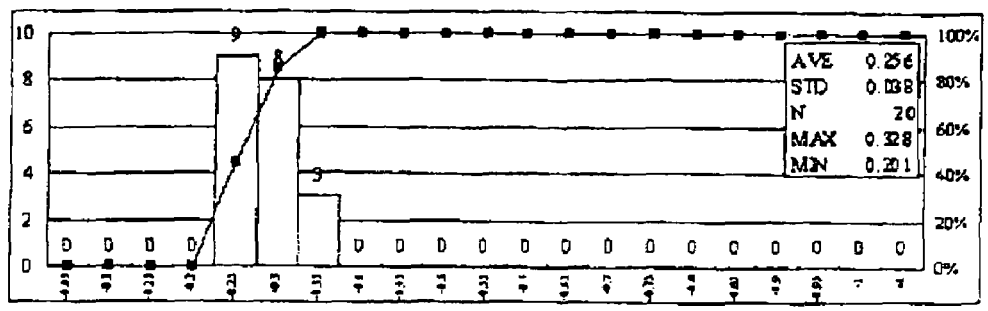

As shown in FIG. 10(a), the average value of the maximum SFQR values for 25 wafers etched with the conventional etching apparatus is 0.392. On the other hand, as shown in FIG. 11(a), the average value of the maximum SFQR values for 20 wafers etched with the etching apparatus employing the present invention is 0.256. Thus, using the etching apparatus employing the present invention improved the average value of the maximum SFQR values by no less than 30% with respect to that obtained with the conventional etching apparatus.

Figure 11B:
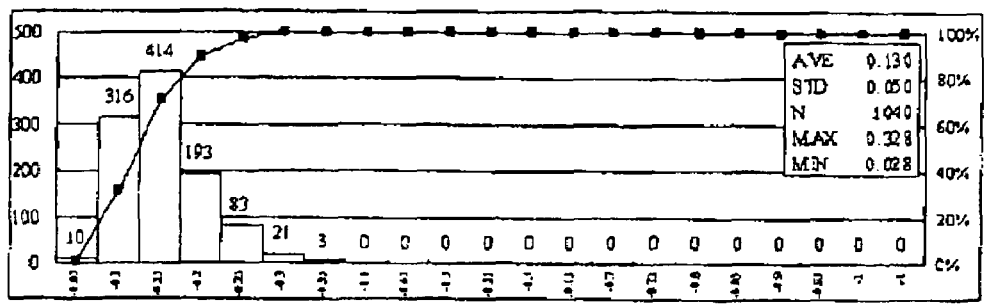
Figure 12:
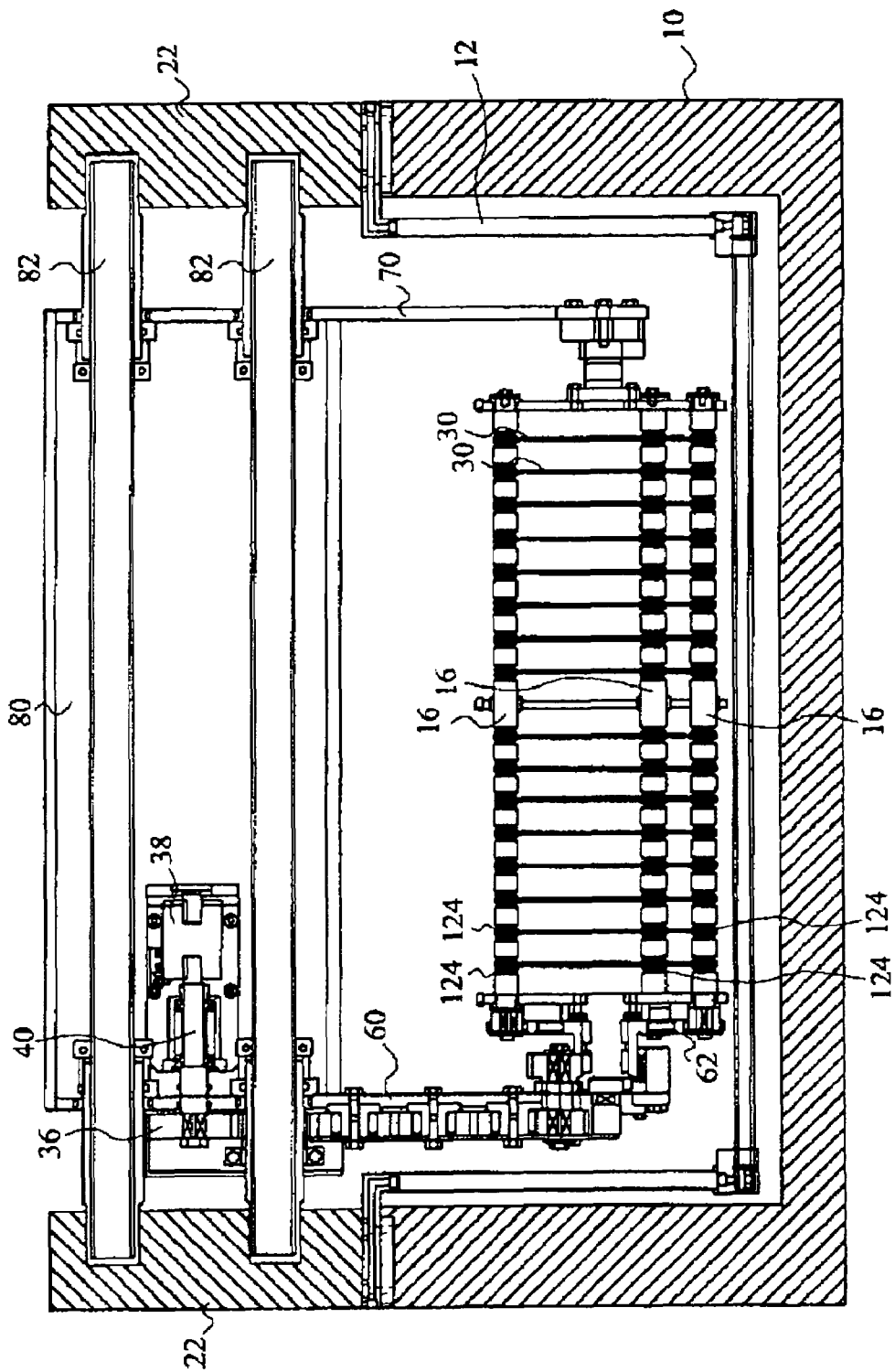
FIG. 12 is a longitudinal sectional view of the conventional etching apparatus, as viewed from the front surface thereof.

Furthermore, as shown in FIG. 10(b), the average value of the SFQR values for 1300 sites sampled from 25 wafers etched with the conventional etching apparatus is 0.205. On the other hand, as shown in FIG. 11(b), the average value of the SFQR values for 1300 sites sampled from 20 wafers etched with the etching apparatus employing the present invention is 0.130. Thus, using the etching apparatus employing the present invention improved the average SFQR value by no less than 35% with respect to that obtained with the conventional etching apparatus.

Furthermore, as shown in FIG. 10(d), in the wafers etched with the conventional etching apparatus, several defected sites with a SFQR of 0.5 μm or more appear in the vicinity of the outer periphery of the wafers. By contrast, as shown in FIG. 11(d), absolutely no defected sites with a SFQR of 0.5 μm or more appeared in the wafers etched with the etching apparatus employing the present invention.

Thus, the test data shown in FIG. 10 and FIG. 11 demonstrate that using the etching apparatus employing the present invention greatly improves the flatness of wafers after etching by comparison with that obtained by using the conventional etching apparatus, and the effect of the present invention is especially significant in the vicinity of the wafer center.

The invention claimed is:

1. An etching method in which two or more disk-shaped members immersed into an etching solution are held in a state where plate surfaces of the members face each other, and etching is conducted while rotating the members, Wherein non-rotating member is disposed between the members.

2. The etching method according to claim 1, wherein the non-rotating member has a substantially disk shape.

3. The etching method according to claim 1, wherein the surface area of the non-rotating member is 95-105% of the surface area of the members.

4. The etching method according to claim 1, wherein the disk-shaped members are semiconductor wafers.

5. An etching apparatus comprising:
an etching chamber filled with an etching solution; and
a plurality of rods rotatably supported in contact with outer peripheries of a plurality of disk-shaped members to rotatably hold the disk-shaped members in a state where the plate surfaces of the disk-shaped members face each other, wherein a non-rotating member having a substantially disk shape is arranged in a position between the disk-shaped members held by the rods.

6. The etching apparatus according to claim 5, further comprising support columns fixed parallel to the rods, wherein the non-rotating member having the substantially disk shape is fixed to the support columns.

7. The etching apparatus according to claim 5, wherein the surface area of the non-rotating member is 95-105% of the surface area of the disk-shaped members.

8. An etching apparatus comprising:
an etching chamber filled with an etching solution;
a plurality of rods rotatably supported in contact with outer peripheries of a plurality of disk-shaped members to rotatably hold the disk-shaped members parallel to one another,
wherein a non-rotating member having substantially disk shape is arranged between two disk-shaped members, and
a protruding section for preventing the rotation of the non-rotating member is provided on the outer periphery thereof.

9. The etching apparatus according to claim 8, wherein the surface area of the non-rotating member having the substantially disk shape is 95-105% of the surface area of the disk-shaped members.

10. The etching apparatus according to claim 8, wherein the non-rotating member having the disk shape is made from polypropylene.

11. A method for manufacturing semiconductor wafers comprising a step of etching two or more wafers immersed into an etching solution, while holding the wafers so that the plate surfaces thereof face each other, the etching being while rotating the wafers,
wherein a non-rotating member is disposed between adjacent wafers.

* * * * *